(12) United States Patent
Ahmed et al.

(10) Patent No.: US 8,976,574 B2
(45) Date of Patent: Mar. 10, 2015

(54) PROCESS CORNER SENSOR FOR BIT-CELLS

(71) Applicant: QUALCOMM Incorporated, San Diego, CA (US)

(72) Inventors: Fahad Ahmed, San Diego, CA (US); Mohamed Hassan Abu-Rahma, San Diego, CA (US); Peng Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 13/799,408

(22) Filed: Mar. 13, 2013

(65) Prior Publication Data

US 2014/0269017 A1    Sep. 18, 2014

(51) Int. Cl.
| | |
|---|---|
| *G11C 11/00* | (2006.01) |
| *H01L 21/66* | (2006.01) |
| *G11C 29/50* | (2006.01) |
| *G11C 29/24* | (2006.01) |
| *G11C 11/41* | (2006.01) |
| *G11C 29/04* | (2006.01) |

(52) U.S. Cl.
CPC ................ *H01L 22/34* (2013.01); *G11C 29/50* (2013.01); *G11C 29/24* (2013.01); *G11C 11/41* (2013.01); *G11C 2029/0403* (2013.01); *G11C 2029/5006* (2013.01)
USPC .......................................... 365/154; 365/205

(58) Field of Classification Search
CPC ... G11C 11/412; G11C 11/413; G11C 11/419
USPC .......................................... 365/154, 205, 156
See application file for complete search history.

(56) References Cited

U.S. PATENT DOCUMENTS

| | | | |
|---|---|---|---|
| 7,200,057 | B2 | 4/2007 | Pineda et al. |
| 7,508,697 | B1 | 3/2009 | Mukhopadhyay et al. |
| 7,606,092 | B2 | 10/2009 | Eby et al. |
| 7,636,268 | B1 * | 12/2009 | Peng .............................. 365/206 |
| 2009/0046519 | A1 | 2/2009 | Wang et al. |
| 2009/0190426 | A1 | 7/2009 | Chuang et al. |
| 2011/0063937 | A1 | 3/2011 | Eid et al. |
| 2012/0063252 | A1 | 3/2012 | Sharma et al. |
| 2012/0075938 | A1 | 3/2012 | Kolar et al. |
| 2013/0021864 | A1 | 1/2013 | Deng et al. |

FOREIGN PATENT DOCUMENTS

| | | |
|---|---|---|
| DE | 10211037 A1 | 6/2003 |
| EP | 0953989 A2 | 11/1999 |

OTHER PUBLICATIONS

International Search Report and Written Opinion—PCT/US2014/020856—ISA/EPO—May 27, 2014.

(Continued)

*Primary Examiner* — Huan Hoang
(74) *Attorney, Agent, or Firm* — Arent Fox LLP (57) ABSTRACT

An integrated circuit is disclosed. The integrated circuit includes a plurality of bit-cells arranged to store data. The integrated circuit also includes a sensor configured to generate an output for determining whether the bit-cells are operating at a process corner. The sensor comprises the same circuitry as the bit-cells.

18 Claims, 6 Drawing Sheets

(56) References Cited

OTHER PUBLICATIONS

Nalam S., et al., "A Technology-Agnostic Simulation Environment (TASE) for iterative custom IC design across processes", Computer Design, 2009. ICCD 2009. IEEE International Conference on, IEEE, Piscataway, NJ, USA, Oct. 4, 2009 , pp. 523-528, XP031627863, ISBN: 978-1-4244-5029-9 section IV.D. "Read/write Assist Evaluation"; figure 9.

* cited by examiner

PROCESS CORNER SENSOR FOR BIT-CELLS

BACKGROUND

1. Field

The present disclosure relates generally to electronic circuits, and more particularly, to a process corner sensor for bit-cells.

2. Background

Integrated circuits have revolutionized the electronic industry by enabling complex circuits consisting of millions of transistors, diodes, resistors and capacitors to be integrated into a chip of semiconductor material. Integration also provides other benefits such as batch manufacturing. The simultaneous manufacture of hundreds or even thousands of integrated circuits onto a single semiconductor wafer reduces cost and increases reliability of the end products.

Figure 1:
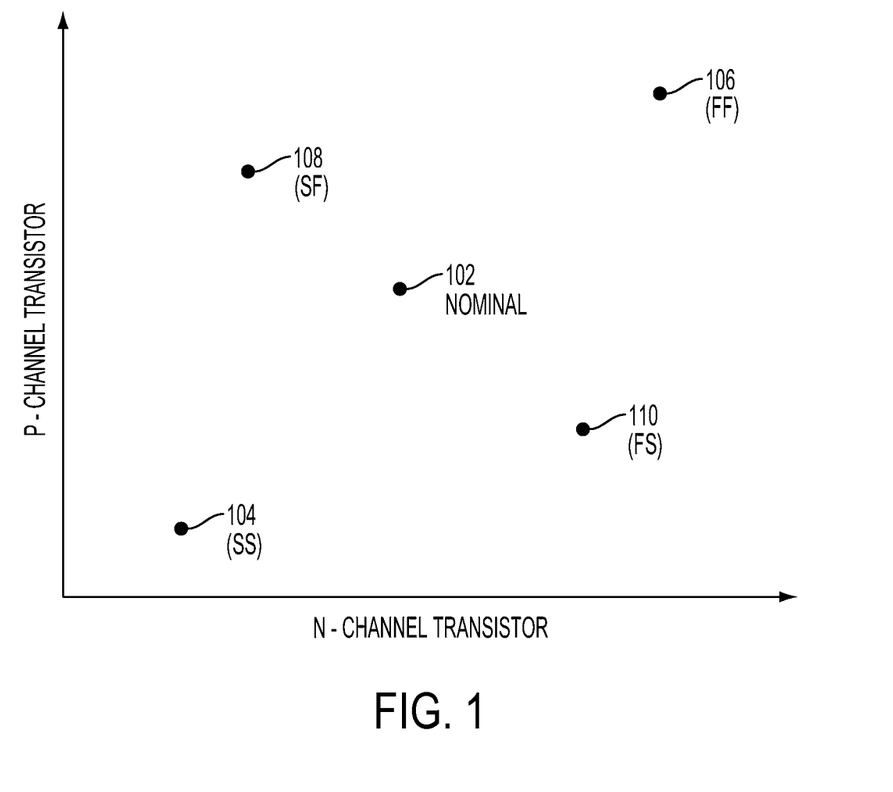
FIG. 1 is a graphical representation showing the distribution of the electrical parameters across CMOS chips manufactured on a single wafer.

Despite the manufacturing benefits of integrated circuits, process variations during the manufacturing process can have an impact on the electrical parameters of the chips, thereby leading to variations in performance. The phrase "process variations" as used throughout this disclosure is intended to refer to global variations. The nature of these process variations will be illustrated with reference to FIG. 1. FIG. 1 is a two-dimensional graph that is typically used to show the distribution of chip parameters for CMOS technology. Statistically, most of the CMOS chips will have electrical parameters that meet the nominal specifications. These CMOS chips may be plotted around the center 102 of the graph. A number of CMOS chips, however, will deviate from the nominal case towards the process corners. Referring to FIG. 1, each process corner is represented by a two-letter designation. The first letter refers to the NMOS transistors and the second letter refers to the PMOS transistors, and each letter has either an F designation for fast or an S designation for slow. Thus, CMOS chips with both types of transistors being slow or fast will be plotted around the slow corner (SS) 104 or fast corner (FF) 106, respectively. There may also be CMOS chips that are plotted around cross corners where one type of transistor is faster and the other type of transistor is slower. By way of example, CMOS chips with slow NMOS transistors and fast PMOS transistors may be plotted around the slow-fast (SF) corner 108. CMOS chips with fast NMOS transistors and slow PMOS transistors may be plotted around the fast-slow (FS) corner 110. Preferably, all the CMOS chips manufactured on the semiconductor wafer can be plotted within the boundaries spanning the process corners. The performance of the CMOS chips that reside outside these boundaries cannot be guaranteed to operate properly under worst case conditions.

Memory is a common circuit implemented within an integrated circuit. A static random access memory (SRAM) is just one example. The SRAM is memory that requires power to retain data. Unlike dynamic random access memory (DRAM), the SRAM does not need to be periodically refreshed. The SRAM also provides faster access to data than DRAM making it an attractive choice for many integrated circuit applications. Unfortunately, chips operating at the FS corner tend to have difficulty reading from SRAM and chips operating at the SF corner tend to have difficulty writing to SRAM. Sensors are commonly used to determine whether a particular chip is operating at a process corner. Depending on the sensor reading, the appropriate assist may be applied during a read or write operation.

Logic based sensors have been used in the past for sensing SRAM process corners. However, because the logic based sensors are fabricated with different processing steps than those used to fabricate the SRAM bit-cells, the correlation between the sensor result and the bit-cell may be poor. Modified bit-cell sensors have also been used in the past to sense SRAM process corners. However, this approach also suffers from poor correlation between the sensor result and the actual bit-cell because the process steps and circuits for the sensor and the bit-cell are still different.

SUMMARY

One aspect of an integrated circuit includes a plurality of bit-cells arranged to store data, and a sensor configured to generate an output for determining whether the bit-cells are operating at a process corner, wherein the sensor comprises the same circuitry as the bit-cells.

Another aspect of an integrated circuit includes a plurality of bit-cells arranged to store data, and sensor means for generating an output to determine whether the bit-cells are operating at a process corner, wherein the sensor means comprises the same circuitry as the bit-cells.

One aspect of method of testing a plurality of bit-cells arranged to store data on an integrated circuit includes generating from a sensor an output for determining whether the bit-cells are operating at a process corner, wherein the sensor comprises the same circuitry as the bit-cells.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, memory, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

In the following detailed description, various aspects of an integrated circuit will be presented in the context of a memory, such as an SRAM. While these aspects may be well suited for this application, those skilled in the art will realize that these aspects may be extended to other forms of hardware. By way of example, various aspects presented throughout this disclosure may be applied to a random access memory (RAM), dynamic RAM (DRAM), static RAM (SRAM), double data rate RAM (DDRAM), read only memory (ROM), programmable ROM (PROM), erasable PROM (EPROM), electrically erasable PROM (EEPROM), cache, shift registers, buffers, any other suitable memories. Accordingly, any reference to a specific memory, such as an SRAM, is intended only to illustrate various concepts with the understanding that such concepts may have a wide range of applications.

An SRAM includes an array of bit-cells with supporting circuitry to decode addresses and perform read and write operations. The array is arranged in rows and columns of bit-cells call called word-lines and bit-lines. Each bit-cell has a unique location or address defined by the intersection of a row and column. The number of bit-cells may be determined by a variety of factors including the size of the memory, the speed requirements of the memory, the layout and testing requirements, and the like. Typically, the array may include thousands of bit-cells.

Figure 2:
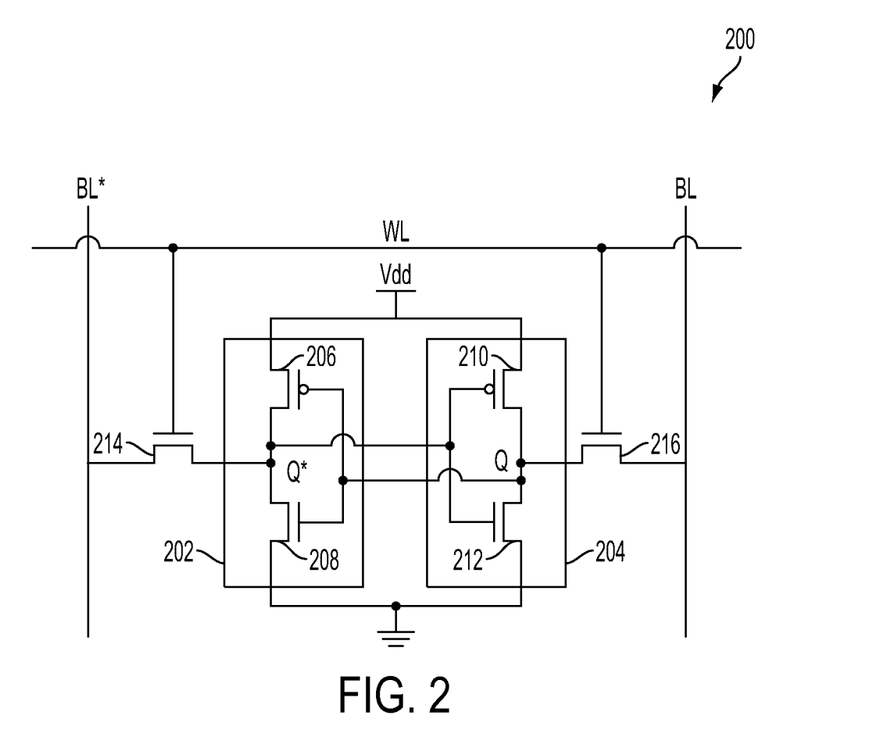
FIG. 2 is a schematic representation illustrating an example of a bit-cell for an SRAM.

FIG. 2 is a schematic representation of a bit-cell for an SRAM. The bit-cell is implemented with a six-transistor (6T) configuration. However, as those skilled in the art will readily appreciate, the bit-cell may be implemented with a four-transistor (4T), eight-transistor (8T), ten-transistor (10T), or any other suitable transistor configuration. The operation of the SRAM will be described in connection with two logic states represented by two voltage bands: one near the supply voltage $V_{DD}$ and one near the supply voltage return, typically ground. The terms "high," "logic level 1," and "pulled-up" may be used to reference the band near the supply voltage $V_{DD}$. The terms "low," "logic level 0," and "pulled-down" may be used to reference the band near the supply voltage return. These terms will also be used to describe the operation of other circuits presented throughout this disclosure.

The bit-cell 200 is shown with two inverters 202, 204. The first inverter 202 comprises a p-channel pull-up transistor 206 and an n-channel pull-down transistor 208. The second inverter 204 comprises a p-channel pull-up transistor 210 and an n-channel pull-down transistor 212. The first and second inverters 202, 204 are interconnected to form a cross-coupled latch. A first n-channel access transistor 214 couples the latch to a first bit-line BL* and a second n-channel access transistor 216 couples the latch to a second bit-line BL. The gates of the n-channel access transistors 214, 216 are coupled to a word-line WL.

The read operation is initiated by precharging both the bit-lines BL, BL* to a logic level 1 and then asserting the word-line WL. The word-line WL is asserted by setting it high, thereby enabling both the access transistors 214, 216. With both the access transistors 214, 216 enabled, the value stored at the output Q* of the first inverter 202 is transferred to the first bit-line BL* and the value stored at the output Q of the second inverter 204 is transferred to the second bit-line BL. By way of example, if the value stored at the output Q is a logic level 0 and the value stored at the output Q* is a logic level 1, the first bit-line BL* will remain in its pre-charged state, while the second bit-line BL is pulled-down through the transistors 212, 216. If the value stored at the output Q is a logic level 1 and the value stored at the output Q* is a logic level 0, the first bit-line BL* is pulled-down through the transistors 208, 214 and the second bit-line BL will remain in its pre-charged state. Either way, the bit-lines BL, BL* are provided to a sense amplifier (not shown) which senses which line has the higher voltage to determine the state of the bit-cell 200.

The write operation is initiated by setting the bit-lines BL, BL* to the value to be written to bit-cell 200 and then asserting the word-line WL. By way of example, a logic level 1 may be written to the bit-cell 200 by setting the first bit-line BL* to a logic level 0 and the second lit-line BL to a logic level 1. The logic level 0 at the first bit-line BL* forces the output Q* of the first inverter 202 to a logic level 0 through the access transistor 214. The logic level 1 at the second bit-line BL forces the output Q of the second inverter 204 to a logic level 1 through the access transistor 216. The bit-line drivers (not shown) are designed to be stronger than the transistors in the bit-cell 200 so that they can override the previous state of the cross-coupled inverters 202, 204. The output Q* of the first inverter 202 is applied to the input of the second inverter 204, which reinforces the output Q of the second inverter 204 at a logic level 1. The output Q of the second inverter 204 is applied to the input of the first inverter 202, which reinforces the output Q* of the first inverter 202 at a logic level 0. A logic level 0 may be written to the bit-cell 200 by inverting the values of the bit-lines BL, BL*.

When the word-line WL is not asserted (i.e., a logic level 0), the access transistors 214, 216 disconnect the bit-lines BL, BL* from the two inverters 202, 204. The output state of the bit-cell 200 is maintained by the cross-coupling between the two inverters 202, 204.

Figure 3:
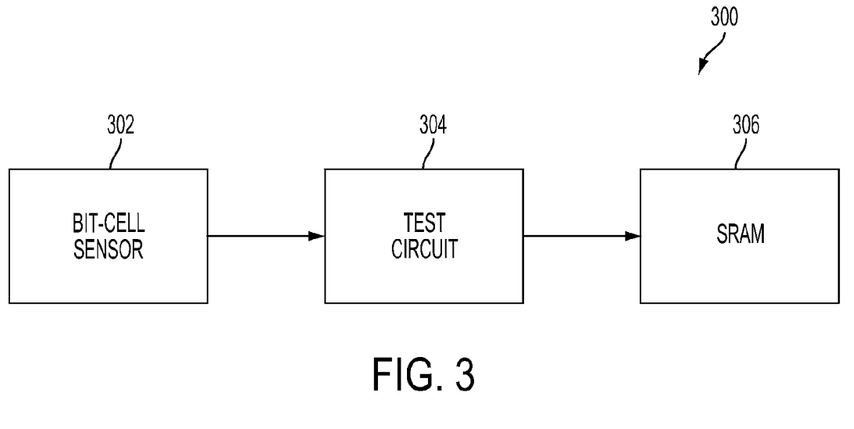
FIG. 3 is a functional block diagram illustrating an example of an integrated circuit with a bit-cell sensor, test circuit and SRAM.

FIG. 3 is a functional block diagram illustrating an example of an integrated circuit with a bit-cell sensor 302, a test circuit 304 and an SRAM 306. As described above, the SRAM 306 includes an array of bit-cells with support circuitry to decode addresses and implement read and write operations. The sensor 302 provides a means for generating an output to determine whether the bit-cells are operating at a process corner. The sensor 302 has the same circuitry as the bit-cells. Accordingly, the electrical parameters of the sensor 302 will correlate well with the electrical parameters of the bit-cells. As a result, the strength of the p-channel and n-channel transistors in the bit-cells can be determined by measuring the current through the p-channel and n-channel transistors in the sensor 302. This provides a non-invasive method of tracking the process corners without affecting the bit-cell layout.

The test circuit 304 may be on or off chip. The test circuit 304 provides a means for determining whether the bit-cells are operating at a process corner based on the output from the sensor 302. The test circuit 304 may be configured to measure the current flowing through the p-channel and n-channel devices independently. In a manner to be described in greater detail later, the test circuit 304 may be configured to measure the current flowing through the p-channel devices in the sensor 302 to determine the strength of the p-channel devices in the bit-cells and then measure the current flowing through the n-channel devices in the sensor 302 to determine the strength of the n-channel devices in the bit-cells. Alternatively, the sequence may be reversed. That is, the test circuit 304 may be configured to first measure the current flowing through the n-channel devices in the sensor 302 and then measure the current flowing through the p-channel devices in the sensor 302. Should the test circuit 304 determine that the bit-cells are operating at a process corner, it may provide the appropriate assist technique to the SRAM 306.

Figure 4:
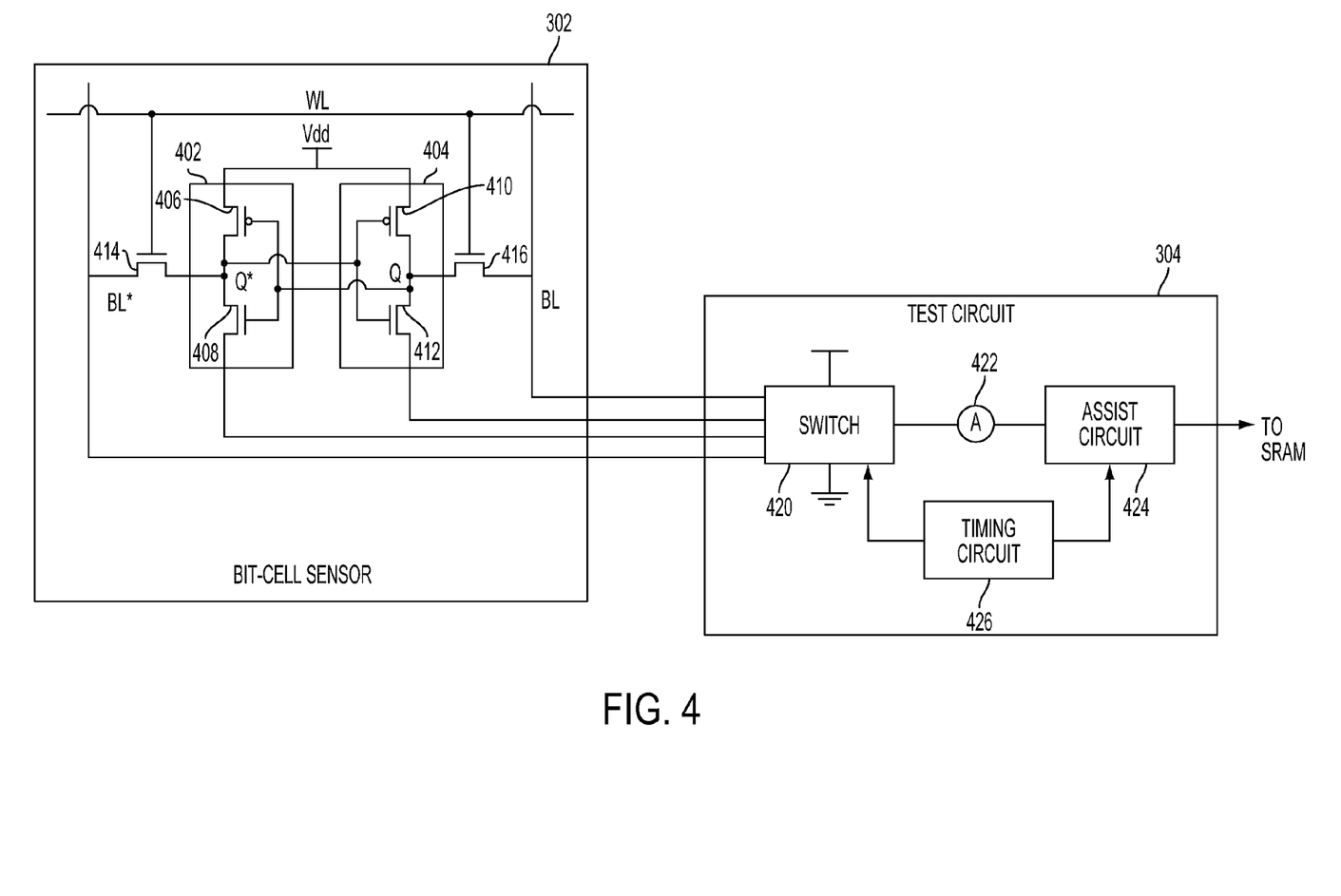
FIG. 4 is a schematic representation of the bit-cell sensor and test circuit presented in FIG. 3.

FIG. 4 is a schematic representation of the bit-cell sensor 302 and test circuit 304 presented in FIG. 3. As described earlier, the sensor 302 has the same circuitry as the bit-cells. Specifically, the sensor 302 includes two inverters 402, 404. The first inverter 402 comprises a p-channel pull-up transistor 406 and an n-channel pull-down transistor 408. The second inverter 404 comprises a p-channel pull-up transistor 410 and an n-channel pull-down transistor 412. The first and second inverters 402, 404 are interconnected to form a cross-coupled latch. A first n-channel access transistor 414 couples the latch to a first bit-line BL* and a second n-channel access transistor 416 couples the latch to a second bit-line BL. The gates of the n-channel access transistors 414, 416 are coupled to a word-line WL.

The p-channel pull-up transistors 406, 410 in the first and second inverters 402, 404, respectively, are connected to the power supply $V_{DD}$. The n-channel pull-down transistors 408, 412 in the first and second inverters 402, 404, respectively, are connected to a switch 420 in the test circuit 304. The bit-lines BL, BL* are also connected to the switch 420. The switch 420 comprises a network of transistor switches (not shown) which is used to switch the n-channel pull-down transistors 408, 412 and the bit-lines BL, BL* between different connections depending on whether the strength of the p-channel or n-channel transistors are being tested. One of these connections is a current meter 422 which provides a means for sensing the current output from the sensor 302 (i.e., the current flowing through the p-channel and n-channel transistors in the sensor 304). A timing circuit 426 may be used to switch the test circuit 304 between a p-channel testing configuration and an n-channel testing configuration.

Figure 5A:
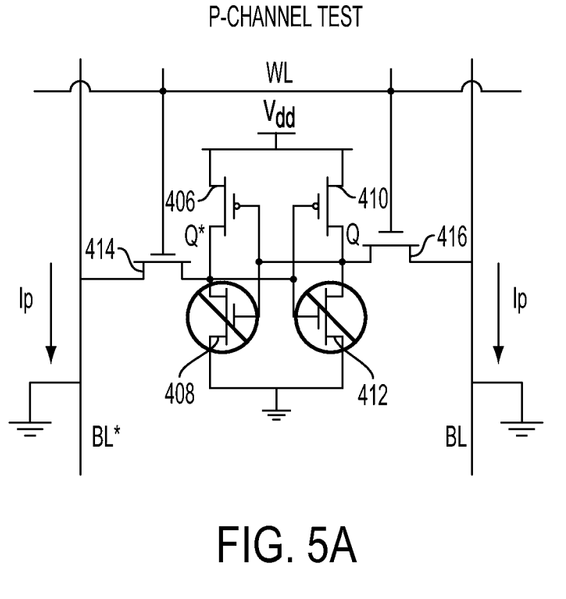
FIG. 5A is a diagram illustrating a conceptual representation of the bit-cell sensor in a p-channel testing configuration.

When the test circuit 304 is in a p-channel testing configuration, the switch 420 connects the n-channel pull-down transistors 408, 412 to ground, one of the bit-lines to ground, and the other bit-line to ground through the current meter 422. The word-line WL is then asserted to turn off the n-channel transistors 408, 412 and turn on the p-channel transistors 406, 410 in the sensor 302. This test configuration is represented conceptually in FIG. 5A. As can be seen from FIGS. 4 and 5A, this test configuration establishes a current path in the sensor 302 through the second bit-line BL via the p-channel transistor 410 and the access transistor 416. The current meter 422 in the test circuit 306 measures the current flowing through the second bit-line BL. The current is primarily a function of the strength of the p-channel transistor 410 because of the relative strengths between the p-channel transistor 410 and the access transistor 416 (i.e., access transistor 416 is stronger than p-channel transistor 410). The same result may be obtained by configuring the switch 420 to connect the first bit-line BL* to ground through current meter 422 and using current meter 422 to measure the current through the p-channel transistor 406 and the access transistor 414.

Figure 5B:
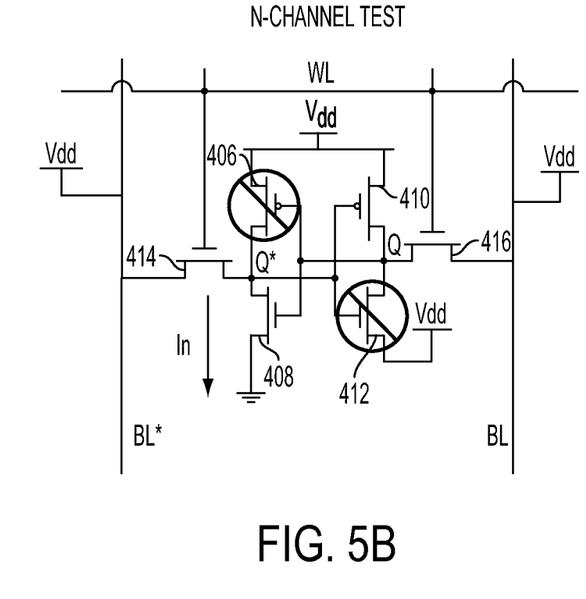
FIG. 5B is a diagram illustrating a conceptual representation of the bit-cell sensor in an n-channel testing configuration.

When the test circuit 304 is in a n-channel testing configuration, the switch 420 connects both bit-lines BL, BL* to the power supply voltage $V_{DD}$, one n-channel transistor 412 to the power supply voltage $V_{DD}$, and the other n-channel transistor 408 to ground through the current meter 422. This configuration emulates the read mode of the bit-cell. This test configuration is represented conceptually in FIG. 5B. As can be seen from FIGS. 4 and 5B, this test configuration establishes a current path in the sensor 302 through the n-channel access transistor 414 and the n-channel transistor 408 in the first inverter 402. The current meter 422 measures the current flowing through these transistors. The current is primarily a function of the strength of the n-channel access transistor 414 because of the relative strengths between the n-channel access transistor 414 and the n-channel transistor 408 (i.e., access transistor 414 is stronger than n-channel transistor 408). The same result may be obtained by applying the power supply voltage $V_{DD}$ to the n-channel transistor 408 and measuring the current through the n-channel access transistor 416 and the n-channel transistor 412 in the second inverter 404.

The output from the current meter 422 may be provided to an assist circuit 424 to determine whether the bit-cells are operating at a process corner. By way of example, if the n-channel transistor current measured by the current meter 422 is above a certain threshold and the p-channel transistor current measured by the current meter 422 is below a certain threshold, the assist circuit 424 may determine that the bit-cells are operating at the FS corner and provide assist to the bit-cells during the read mode. Conversely, if the n-channel transistor current measured by the current meter 422 is below a certain threshold low and the p-channel transistor current measured by the current meter 422 is above a certain threshold, the assist circuit 424 may determine that the bit-cells are operating at the SF corner and provide assist to the bit-cells during the write mode. Read and write assist are well known in the art, and therefore, will not be described any further. Those skilled in the art will readily be able to determine the appropriate assist technique for any particular application.

As discussed earlier, the bit-cell sensor has the same circuitry as the bit-cells. The phrase "same circuitry" as used herein means that the sensor and the bit-cells have the same components with the same interconnects. However, the inputs and outputs to the sensor and the bit-cells may be different. The inputs and outputs include the power and ground connections. By way of example, the sensor and the bit-cells described thus far have the "same circuitry" even though the source of the n-channel pull-down transistors in the bit-cells are connected to ground while the source of one n-channel transistor in the sensor is switched between power and ground in the test circuit. Preferably, the sensor and the bit-cells have the same physical layout, but this is not a requirement for the two to have the "same circuitry." For example, the source of the n-channel pull-down transistors in the bit-cells may have a common connection to ground. However, the source of the n-channel pull-down transistors in the sensor may have individual connections to ground through the switch in the test circuit. Yet, the sensor and the bit-cells have the "same circuitry" because they have the same components with the same interconnects. That is, the sensor and the bit-cells both have the same cross-coupled inverter configuration with the same connections to access transistors. The manner in which the bit-lines, word-line, power, and ground are connected to the sensor and bit-lines has no bearing on whether the two have the same circuitry.

Figure 6:
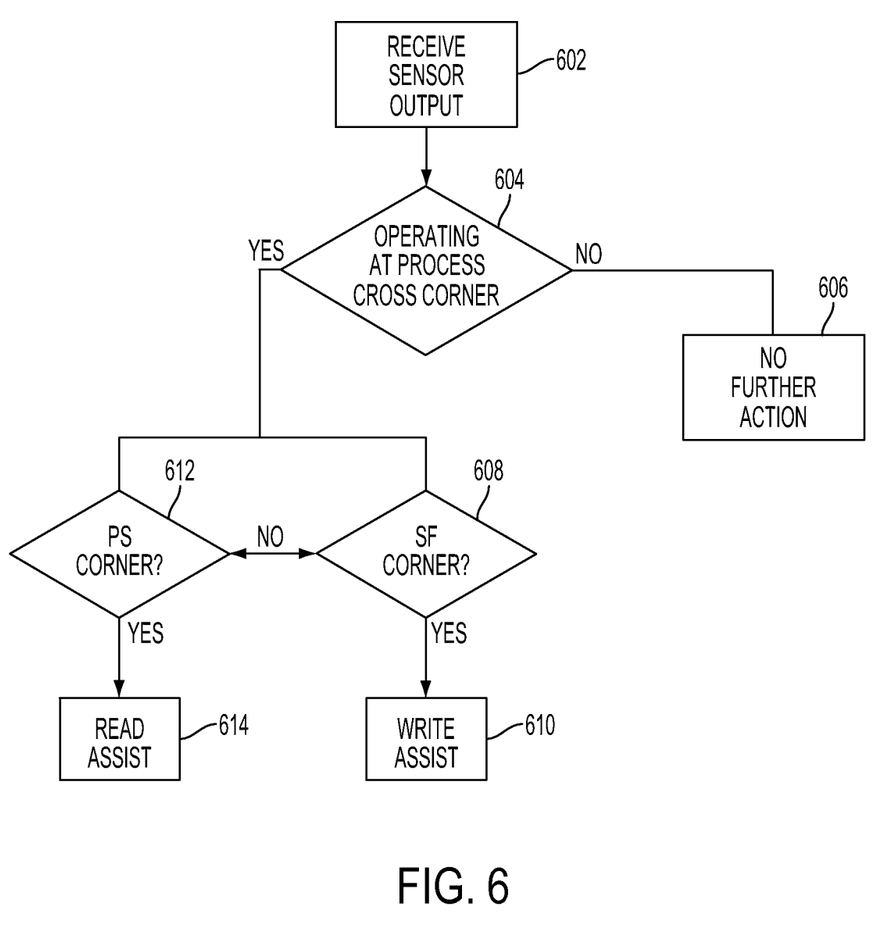
FIG. 6 is a flow chart illustrating an example of a testing methodology to determine whether the bit-cells of an SRAM are operating at a process corner.

FIG. 6 is a flow chart illustrating an example of a method by which the test circuit 304 tests a plurality of bit-cells arranged to store data on an integrated circuit. In block 602, the test circuit receives the output from the bit-cell sensor. In block 604, the test circuit determines whether the bit-cells are operating at a process cross corner (i.e., the SF or FS corner) based on the sensor output. In at least one embodiment, the test circuit is configured to sense the current output from the sensor and determine whether the bit-cells are operating at a process cross corner, but the test circuit may be used to test for any combination of one or more process corners depending on the particular application and the overall design constraints imposed on the system. Returning to FIG. 6, no action is taken by the test circuit in block 606 if it determines that the bit-cells are not operating at a cross corner. If, on the other hand, the test circuit determines that the bit-cells are operating at either cross corner, then it provides the appropriate assist to the SRAM. Specifically, if the test circuit determines in block 608 that the bit-cells are operating at the SF corner, then it provides write assist to the SRAM in block 610. Alternatively, if the test circuit determines in block 612 that the bit-cells are operating at the FS corner, then it provides read assist to the SRAM cells in block 614.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit, comprising:
   a plurality of bit-cells arranged to store data; and
   a sensor configured to generate an output for determining whether the bit-cells are operating at a process corner, wherein the sensor comprises
      two cross-coupled inverters, each of the cross-coupled inverters comprising a p-channel pull-up transistor and an n-channel pull-down transistor,
      a first access transistor configured to connect a first bit-line to an input of a first one of the inverters when a word-line is asserted, and
      a second access transistor configured to a connect a second bit-line to an input of a second one of the inverters when the word-line is asserted; and
   circuitry configured to:
      sense a first current flowing through one of the p-channel pull-up transistors with each of the first and second bit-lines pulled-down,
      sense a second current flowing through one of the n-channel pull-down transistors with each of the first and second bit-lines pulled-up,
      determine whether the bit-cells are operating at the process corner based on the first and second sensed currents, and
      sense the second current flowing through said one of the n-channel pull-down transistors with a source of an other n-channel pull-down transistor pulled-up.

2. The integrated circuit of claim 1 further comprising circuitry configured to determine whether the bit-cells are operating at the process corner based on the sensor output.

3. The integrated circuit of claim 2 wherein the circuitry is further configured to sense current output from the sensor and determine whether the bit-cells are operating at the process corner based on the sensed current.

4. The integrated circuit of claim 2 wherein the circuitry is further configured to provide assist to the bit-cells if the circuitry determines that the bit-cells are operating at the process corner.

5. The integrated circuit of claim 4 wherein the circuitry is further configured to provide read assist to the bit-cells if the circuitry determines that the process corner is a fast-slow (FS) corner.

6. The integrated circuit of claim 4 wherein the circuitry is further configured to provide write assist to the bit-cells if the circuitry determines that the process corner is a slow-fast (SF) corner.

7. An integrated circuit, comprising:
   a plurality of bit-cells arranged to store data; and
   sensor means for generating an output to determine whether the bit-cells are operating at a process corner, wherein the sensor means comprises
      two cross-coupled inverters, each of the cross-coupled inverters comprising a p-channel pull-up transistor and an n-channel pull-down transistor,
      a first access transistor configured to connect a first bit-line to an input of a first one of the inverters when a word-line is asserted, and
      a second access transistor configured to a connect a second bit-line to an input of a second one of the inverters when the word-line is asserted; and
   circuit means for determining whether the bit-cells are operating at the process corner configured to:

sense a first current flowing through one of the p-channel pull-up transistors with each of the first and second bit-lines pulled-down, sense a second current flowing through one of the n-channel pull-down transistors with each of the first and second bit-lines pulled-up, determine whether the bit-cells are operating at the process corner based on the first and second sensed currents, and sense the second current flowing through said one of the n-channel pull-down transistors with a source of an other n-channel pull-down transistor pulled-up.

8. The integrated circuit of claim 7 further comprising circuit means for determining whether the bit-cells are operating at the process corner based on the output from the sensor means.

9. The integrated circuit of claim 8 wherein the circuit means comprises means for sensing current output from the sensor means, the circuit means being configured to determine whether the bit-cells are operating at the process corner based on the sensed current.

10. The integrated circuit of claim 9 wherein the circuit means is configured to provide assist to the bit-cells if the circuit means determines that the bit-cells are operating at the process corner.

11. The integrated circuit of claim 10 wherein the circuit means is further configured to provide read assist to the bit-cells if the circuit means determines that the process corner is a fast-slow (FS) corner.

12. The integrated circuit of claim 10 wherein the circuit means is further configured to provide write assist to the bit-cells if the circuit means determines that the process corner is a slow-fast (SF) corner.

13. A method of testing a plurality of bit-cells arranged to store data on an integrated circuit, the method comprising:

generating from a sensor an output for determining whether the bit-cells are operating at a process corner, wherein the sensor comprises two cross-coupled inverters, each of the cross-coupled inverters comprising a p-channel pull-up transistor and an n-channel pull-down transistor, a first access transistor configured to connect a first bit-line to an input of a first one of the inverters when a word-line is asserted, and a second access transistor configured to a connect a second bit-line to an input of a second one of the inverters when the word-line is asserted; and determining whether the bit-cells are operating at the process corner by sensing a first current flowing through one of the p-channel pull-up transistors with each of the first and second bit-lines pulled-down, and sensing a second current flowing through one of the n-channel pull-down transistors with each of the first and second bit-lines pulled-up, wherein the second current flows through said one of the n-channel pull-down transistors with a source of the other n-channel pull-down transistor pulled-up, and wherein the determining is based on the first and second sensed currents.

14. The method of claim 13 further comprising determining whether the bit-cells are operating at the process corner based on the sensor output.

15. The method of claim 14 wherein the determining of whether the bit-cells are operating at the process corner comprises sensing current output from the sensor and determining whether the bit-cells are operating at the process corner based on the sensed current.

16. The method of claim 14 further comprising providing assist to the bit-cells if the bit-cells are operating at the process corner.

17. The method of claim 16 wherein the providing of the assist comprises providing read assist to the bit-cells if the process corner is a fast-slow (FS) corner.

18. The integrated circuit of claim 16 wherein the providing of the assist comprises providing write assist to the bit-cells if the process corner is a slow-fast (SF) corner.

* * * * *